United States Patent
Lai et al.

(10) Patent No.: US 10,783,032 B2
(45) Date of Patent: Sep. 22, 2020

(54) NON-VOLATILE MEMORY APPARATUS AND READING METHOD THEREOF

(71) Applicant: VIA Technologies, Inc., New Taipei (TW)

(72) Inventors: Yi-Lin Lai, New Taipei (TW); Chen-Te Chen, New Taipei (TW); Ying-Che Chung, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 145 days.

(21) Appl. No.: 15/662,254

(22) Filed: Jul. 27, 2017

(65) Prior Publication Data

US 2018/0329776 A1 Nov. 15, 2018

(30) Foreign Application Priority Data

May 12, 2017 (TW) .............................. 106115688 A

(51) Int. Cl.

| | | |
|---|---|---|
| G06F 11/00 | (2006.01) | |
| G06F 11/10 | (2006.01) | |
| G11C 29/52 | (2006.01) | |
| H03M 13/29 | (2006.01) | |
| H03M 13/09 | (2006.01) | |
| H03M 13/15 | (2006.01) | |
| H03M 13/11 | (2006.01) | |

(52) U.S. Cl.
CPC ...... *G06F 11/1068* (2013.01); *G06F 11/1004* (2013.01); *G06F 11/1048* (2013.01);
(Continued)

(58) Field of Classification Search
CPC ............. G06F 11/1004; G06F 11/1008; G06F 11/1048; G06F 11/1076; G06F 11/1068;
(Continued)

(56) References Cited

U.S. PATENT DOCUMENTS

| | | | |
|---|---|---|---|
| 6,408,372 B1 * | 6/2002 | Miyauchi ............. | G11C 7/1006 711/167 |
| 2005/0055621 A1 * | 3/2005 | Adelmann .......... | G06F 11/1008 714/758 |

(Continued)

FOREIGN PATENT DOCUMENTS

| | | |
|---|---|---|
| TW | I451434 | 9/2014 |
| WO | 2016145328 | 9/2016 |

OTHER PUBLICATIONS

"Office Action of Taiwan Counterpart Application," dated Oct. 30, 2017, p. 1-p. 17, in which the listed references were cited.

*Primary Examiner* — Albert Decady
*Assistant Examiner* — Osman M Alshack
(74) *Attorney, Agent, or Firm* — JCIPRNET

(57) ABSTRACT

A non-volatile memory apparatus includes an error checking and correcting (ECC) decoding circuit, a main buffer circuit, a multiplexer, and an interface circuit. The ECC decoding circuit decodes an original codeword to obtain a decoded codeword. The main buffer circuit is coupled to the ECC decoding circuit for receiving and storing a first data portion of the decoded codeword. The multiplexer's first input end is coupled to the output end of the main buffer circuit. The second input end of the multiplexer is coupled to the output end of the ECC decoding circuit. The interface circuit is coupled to the output end of the multiplexer and receives the first data portion from the multiplexer to provide the first data portion to a host.

9 Claims, 10 Drawing Sheets

(52) U.S. Cl.
CPC ......... *G11C 29/52* (2013.01); *H03M 13/2906* (2013.01); *H03M 13/09* (2013.01); *H03M 13/1102* (2013.01); *H03M 13/152* (2013.01)

(58) Field of Classification Search
CPC ........... G06F 11/1044; H03M 13/2906; H03M 13/09; H03M 13/091; H03M 13/093; H03M 13/095; H03M 13/1102; H03M 13/152; G11B 2020/1843
USPC ................................ 714/752, 755, 758, 763
See application file for complete search history.

(56) References Cited

U.S. PATENT DOCUMENTS

| | | | | |
|---|---|---|---|---|
| 2008/0098276 A1* | 4/2008 | Naoi | ..................... | H04L 1/1819 714/751 |
| 2008/0163033 A1* | 7/2008 | Yim | .................... | G06F 11/1008 714/785 |
| 2008/0244356 A1* | 10/2008 | Bliss | ................. | H03M 13/2906 714/755 |
| 2009/0193319 A1* | 7/2009 | Shen | ....................... | G06F 11/10 714/777 |
| 2010/0211834 A1* | 8/2010 | Asnaashari | ............. | G06F 11/10 714/718 |
| 2012/0166906 A1* | 6/2012 | Nagadomi | .......... | G06F 11/1048 714/755 |
| 2013/0124940 A1* | 5/2013 | Yang | .................. | H03M 13/1108 714/755 |
| 2013/0179748 A1* | 7/2013 | Dong | .................. | G06F 11/1012 714/755 |
| 2013/0332797 A1* | 12/2013 | Chung | .................... | G06F 11/10 714/763 |
| 2015/0135031 A1* | 5/2015 | Cohen | ................ | G06F 11/1068 714/758 |
| 2015/0254129 A1* | 9/2015 | Authement | ......... | G06F 11/1048 714/704 |

* cited by examiner

NON-VOLATILE MEMORY APPARATUS AND READING METHOD THEREOF

CROSS-REFERENCE TO RELATED APPLICATION

This application claims the priority benefit of Taiwan application serial no. 106115688, filed on May 12, 2017. The entirety of the above-mentioned patent application is hereby incorporated by reference herein and made a part of this specification.

BACKGROUND OF THE INVENTION

Field of the Invention

The invention relates to a memory apparatus and more particularly relates to a non-volatile memory (NVM) apparatus and a reading method thereof.

Description of Related Art

Flash memory storage equipment has better performance in reading/writing and lower power consumption than the traditional hard disk drives. Thus, flash memories have been extensively used in various data storage systems. The reading performance of flash memories is generally evaluated based on two indicators, i.e., non-sequential read rate (e.g., random read rate) and sequential read rate. When sequential reading is executed, usually a larger packet is used. In contrast thereto, when non-sequential reading is executed, the flash memory sends data in the form of a small packet (in the unit of 4K bytes or smaller, for example) to the host. Generally speaking, non-sequential read rate is lower than sequential read rate, and it becomes the bottleneck for the reading performance of flash memories. Considering the growing demand for higher memory read rate, electronic products need a new reading technique for enhancing the non-sequential read rate of flash memories.

SUMMARY OF THE INVENTION

The invention provides a non-volatile memory (NVM) apparatus and a reading method thereof for reducing the pipeline stages during non-sequential reading, so as to accelerate the non-sequential read rate.

In an embodiment of the invention, a NVM apparatus is provided, which includes an error checking and correcting (ECC) decoding circuit, a main buffer circuit, a multiplexer, and an interface circuit. The ECC decoding circuit is configured to decode an original codeword to obtain a decoded codeword. The main buffer circuit is coupled to an output end of the ECC decoding circuit to receive and store a first data portion of the decoded codeword. A first input end of the multiplexer is coupled to an output end of the main buffer circuit. A second input end of the multiplexer is coupled to the output end of the ECC decoding circuit to receive the first data portion. In a first operation mode, the multiplexer selectively couples the first input end of the multiplexer to an output end of the multiplexer. In a second operation mode, the multiplexer selectively couples the second input end of the multiplexer to the output end of the multiplexer. The interface circuit is coupled to the output end of the multiplexer and receives the first data portion from the output end of the multiplexer to provide the first data portion to a host.

In an embodiment of the invention, a reading method of the NVM apparatus is provided. The reading method includes: decoding the original codeword by the ECC decoding circuit to obtain the decoded codeword; in the first operation mode, transmitting the first data portion of the decoded codeword to the interface circuit via the main buffer circuit; in the second operation mode, transmitting the first data portion to the interface circuit by bypassing the main buffer circuit; and providing the first data portion to the host by the interface circuit.

In an embodiment of the invention, a NVM apparatus is provided, which includes an ECC decoding circuit, an interface circuit, a first cyclic redundancy check (CRC) circuit, and a second CRC circuit. The ECC decoding circuit is configured to decode an original codeword to obtain a decoded codeword, wherein the decoded codeword includes a first data portion and a first CRC code. The interface circuit is coupled to an output end of the ECC decoding circuit to receive the first data portion, wherein the interface circuit is configured to provide the first data portion to a host. The first CRC circuit is coupled to the ECC decoding circuit to receive the first data portion and the first CRC code. The first CRC circuit is configured to perform a first cyclic redundancy check on the first data portion and generate a check status message based on a relationship between a result of the first cyclic redundancy check and the first CRC code. The second CRC circuit is coupled to the interface circuit to receive the first data portion. The second CRC circuit is configured to perform a second cyclic redundancy check on the first data portion to generate a second CRC code. According to the check status message of the first CRC circuit, the second CRC circuit determines whether to further change the second CRC code to make the second CRC code not match the first data portion.

In an embodiment of the invention, a reading method of the NVM apparatus is provided. The reading method includes: decoding the original codeword by the ECC decoding circuit to obtain the decoded codeword, wherein the decoded codeword includes the first data portion and the first CRC code; providing the first data portion to the host via the interface circuit; performing the first cyclic redundancy check on the first data portion provided by the ECC decoding circuit by the first CRC circuit, and generating the check status message based on the relationship between the result of the first cyclic redundancy check and the first CRC code; performing the second cyclic redundancy check on the first data portion provided by the interface circuit by the second CRC circuit to generate the second CRC code; and determining whether to further change the second CRC code to make the second CRC code not match the first data portion according to the check status message.

Based on the above, according to the NVM apparatus and the reading method thereof provided in the embodiments of the invention, the pipeline stages during non-sequential reading are reduced by bypassing the main buffer circuit, so as to accelerate the non-sequential read rate.

To make the aforementioned and other features and advantages of the invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
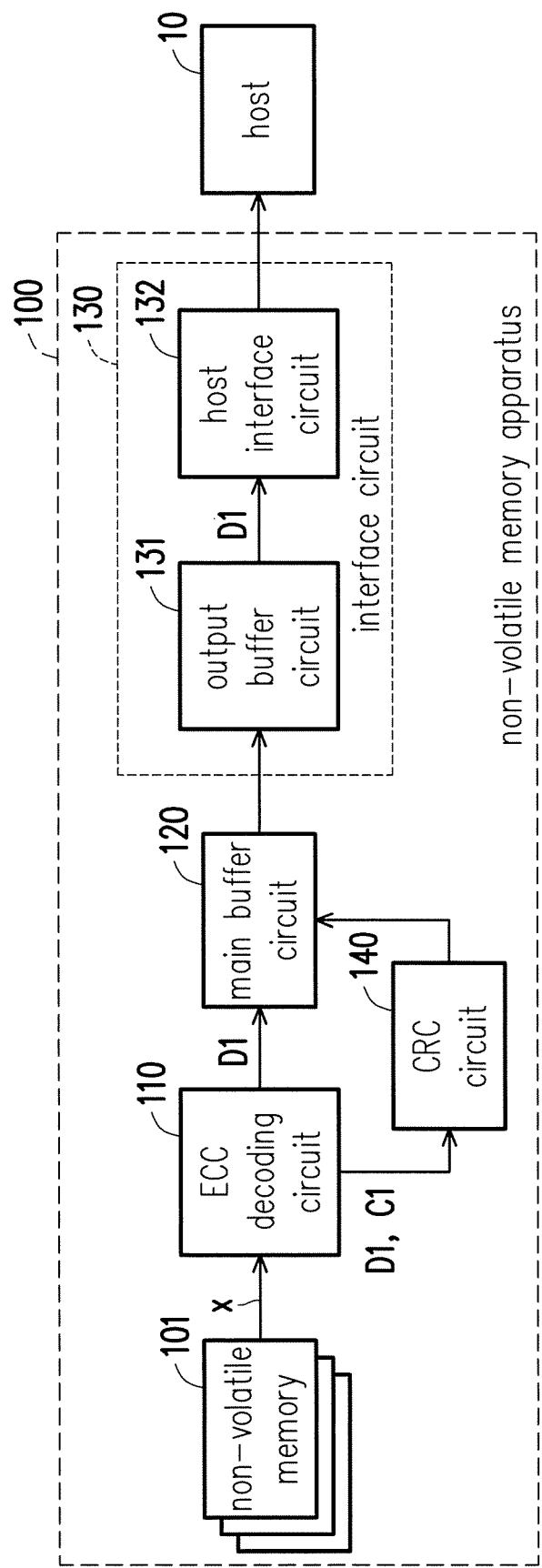
FIG. 1 is a circuit block diagram illustrating a non-volatile memory (NVM) apparatus.

The term "couple (or connect)" used throughout this specification (including the claims) may refer to any direct or indirect connection means. For example, if it is described that the first device is coupled (or connected) to the second device, it should be understood that the first device may be directly connected to the second device or indirectly connected to the second device through other devices or certain connection means. Moreover, elements/components/steps with the same reference numerals represent the same or similar parts in the figures and embodiments where appropriate. Descriptions of the elements/components/steps with the same reference numerals or terms in different embodiments may be reference for one another.

FIG. 1 is a circuit block diagram illustrating a non-volatile memory (NVM) apparatus 100. A host 10 may be a computer, a hand-held electronic device, or other electronic devices. For example, the host 10 may be a personal computer, a hand-held computer, a personal digital assistant (PDA), a portable media player (PMP), a MP3 player, a smart phone, a digital camera, a camcorder, a recorder, a game console, a fax machine, a scanner, a printer, etc. The NVM apparatus 100 may be a personal computer memory card international association (PCMCIA) card, a compact flash (CF) card, a smart media card (SMC), a memory stick, a multimedia card (MMC, such as RS-MMC and MMC-micro), a secure digital card (SD, such as mini SD, micro SD, and SDHC), a universal flash storage (UFS) device, a solid state disk/drive (SSD), etc. The NVM apparatus 100 may store audio, image, video data, and/or other digital data for different application contexts.

The NVM apparatus 100 is coupled to the host 10. The NVM apparatus 100 may provide the host 10 a storage space. The host 10 may be connected to the NVM apparatus 100 via any standardized interface (or non-standard interface). For example, the standardized interface may include a small computer system interface (SCSI), a serial attached SCSI (SAS), an enhanced small disk interface (ESDI), a serial advanced technology attachment (SATA), a peripheral component interconnect express (PCIe), an integrated drive electronics (IDE) interface, a universal serial bus (USB), a Thunderbolt interface, or other interfaces. Nevertheless, this embodiment is not intended to limit the interface structure between the host 10 and the NVM apparatus 100.

The NVM apparatus 100 includes a NVM 101, an error checking and correcting (ECC) decoding circuit 110, a main buffer circuit 120, an interface circuit 130, and a cyclic redundancy check (CRC) circuit 140. According to the design requirements, the NVM 101 may be a NAND flash memory or other non-volatile storage circuits/components. The NVM 101 has a plurality of physical blocks to provide a storage space for storing data. The interface circuit 130 is coupled to the host 10 via the aforementioned standardized interface (or non-standard interface). The host 10 may read data from the NVM 101 via the interface circuit 130, the main buffer circuit 120, and the ECC decoding circuit 110.

Generally, when a certain memory cell of the flash memory (the NVM 101) is read, the way that the flash memory is read will cause the bit data of other memory cells that are close to the certain memory cell in the same physical page (or physical block) to change unexpectedly. It is the so-called data read disturbance. For one physical page of the flash memory, in the case where this physical page is read several times, the number of erroneous bits in this physical page increases as time increases (or as the number of times of reading increases). In order to reduce the error rate of reading the physical page, the ECC decoding circuit 110 may perform ECC decoding on the data that is to be read (an original codeword x) to obtain a decoded codeword, wherein the decoded codeword may be divided into at least two portions, which are a first data portion D1 and a first CRC code C1 for checking the correctness of the first data portion D1. Therefore, the ECC decoding circuit 110 may detect whether the original codeword x is erroneous for correction.

According to the design requirements, the ECC decoding circuit 110 may use any algorithm to perform the ECC decoding on the original codeword x of the NVM 101, so as to obtain the decoded codeword including the first data portion D1 and the first CRC code C1. In an example (but not limited thereto), the ECC decoding circuit 110 may perform the ECC decoding on the original codeword x by a low-density parity-check code (LDPC) decoding algorithm, a Bose-Chaudhuri-Hocquenghem (BCH) decoding algorithm, or other algorithms, so as to obtain the decoded codeword (the first data portion D1 and the first CRC code C1).

The input end of the main buffer circuit 120 is coupled to the output end of the ECC decoding circuit 110 for receiving and storing the first data portion D1 in the decoded codeword. The main buffer circuit 120 may provide a buffer space for storing a plurality of decoded codewords outputted by the ECC decoding circuit 110. Meanwhile, the first data portion D1 and the first CRC code C1 in the decoded codeword are transmitted to the CRC circuit 140. After the ECC decoding circuit 110 completes the ECC decoding, the CRC circuit 140 may further perform a cyclic redundancy check (CRC) on the first data portion D1 in the decoded codeword according to the first CRC code C1 in the decoded codeword, so as to determine whether the first data portion D1 is correct. According to the design requirements, the CRC circuit 140 may use any algorithm to perform the cyclic redundancy check on the first data portion D1, such as the conventional algorithm or other cyclic redundancy check algorithms.

For example, the CRC circuit 140 may calculate a second CRC code corresponding to the first data portion D1 according to the content of the first data portion D1 and compares the first CRC code C1 and the second CRC code. If the original codeword x is erroneous (that is, the first data portion D1 is erroneous), the second CRC code calculated by the CRC circuit 140 is different from the first CRC code C1. In that case, the CRC circuit 140 may send a signal to the main buffer circuit 120 to prevent the main buffer circuit 120 from transmitting the erroneous first data portion D1 to the interface circuit 130. If the first data portion D1 and the first CRC code C1 are correct, the second CRC code calculated by the CRC circuit 140 is the same as the first CRC code C1. In that case, the main buffer circuit 120 may continue transmitting the first data portion D1 to the interface circuit 130.

The interface circuit 130 is coupled to the output end of the main buffer circuit 120 to receive the first data portion D1. The interface circuit 130 may transmit the first data portion D1 provided by the main buffer circuit 120 to the host 10. In the embodiment shown in FIG. 1, the interface circuit 130 includes an output buffer circuit 131 and a host interface circuit 132. The input end of the output buffer circuit 131 is coupled to the output end of the main buffer circuit 120 to receive and temporarily store the first data portion D1. The output buffer circuit 131 may provide a buffer space for storing the data that is to be outputted to the host 10 by the interface circuit 130. The host interface circuit 132 is coupled to the output end of the output buffer circuit 131 to receive the first data portion D1. The host interface circuit 132 may provide the first data portion D1 to the host 10.

If the decoding speed of the ECC decoding circuit 110 does not match the reading speed of the host 10, the main buffer circuit 120 may provide a buffer function between the ECC decoding circuit 110 and the host 10. When sequential reading is performed on the NVM 101, usually a very large amount of data is read every time, and at the time, the main buffer circuit 120 may provide a buffer space for storing the sequentially read data outputted by the ECC decoding circuit 110. When non-sequential reading is performed on the NVM 101, the data read every time is usually small data, e.g., data of 4K bytes (or smaller). When non-sequential reading is performed on the NVM 101, the buffer function of the main buffer circuit 120 may not be required.

Figure 2:
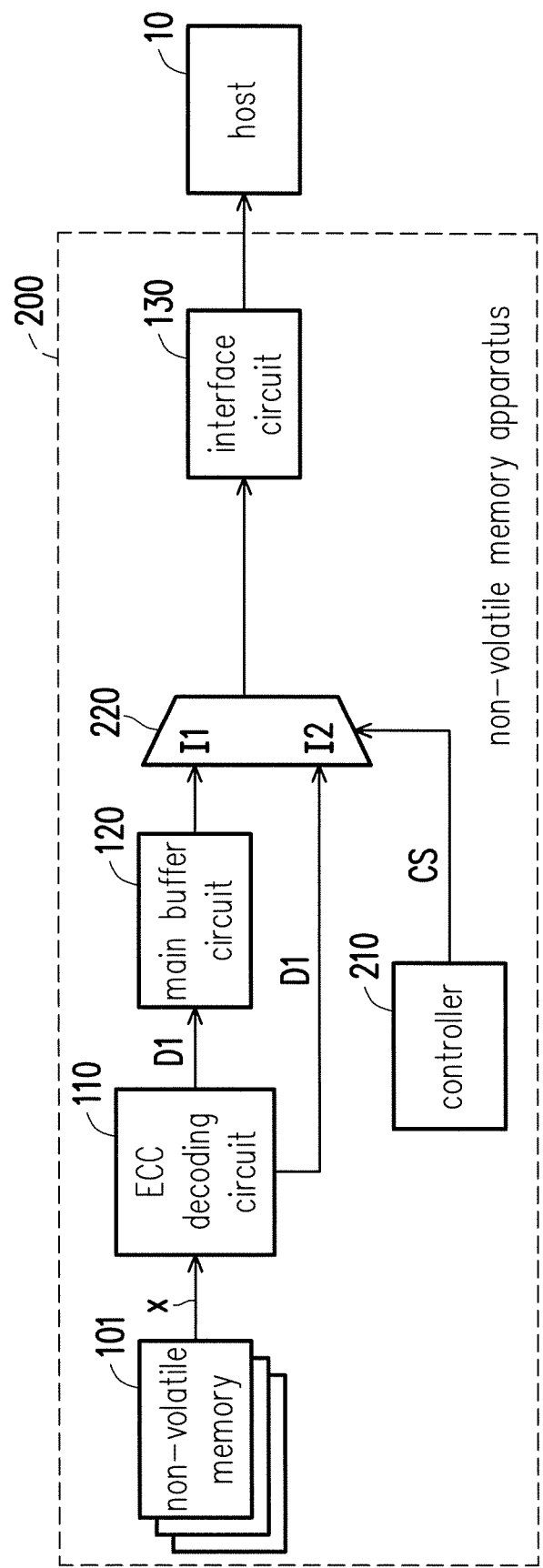
FIG. 2 is a circuit block diagram illustrating a NVM apparatus according to an embodiment of the invention.

FIG. 2 is a circuit block diagram illustrating a NVM apparatus 200 according to an embodiment of the invention. The NVM apparatus 200 is coupled to a host 10. The NVM apparatus 200 may provide the host 10 a storage space. Details of the host 10 as shown in FIG. 2 have been specified above with reference to FIG. 1. The NVM apparatus 200 may be a PCMCIA card, a CF card, a SMC, a memory stick, a MMC (such as RS-MMC and MMC-micro), a SD card (such as mini SD, micro SD, and SDHC), a UFS device, a solid state disk/drive (SSD), etc. The NVM apparatus 200 may store audio, image, video data, and/or other digital data for different application contexts.

The host 10 may be connected to the NVM apparatus 200 via any standardized interface (or non-standard interface). For example, the standardized interface may include a SCSI interface, a SAS interface, an ESDI interface, a SATA interface, a PCI-express interface, an IDE interface, a USB interface, a Thunderbolt interface, or other interfaces. Nevertheless, this embodiment is not intended to limit the interface structure between the host 10 and the NVM apparatus 200.

The NVM apparatus 200 includes a NVM 101, an error checking and correcting (ECC) decoding circuit 110, a main buffer circuit 120, a controller 210, a multiplexer 220, and an interface circuit 130. The interface circuit 130 is coupled to the host 10 via the aforementioned standardized interface (or non-standard interface). Details of the NVM 101, the ECC decoding circuit 110, the main buffer circuit 120, and the interface circuit 130 as shown in FIG. 2 have been specified above with reference to FIG. 1 and thus are not repeated hereinafter.

The controller 210 is coupled to the control end of the multiplexer 220. A first input end I1 of the multiplexer 220 is coupled to the output end of the main buffer circuit 120. A second input end I2 of the multiplexer 220 is coupled to the output end of the ECC decoding circuit 110 to receive the first data portion D1. The interface circuit 130 is coupled to the output end of the multiplexer 220. The interface circuit 130 receives the first data portion D1 from the output end of the multiplexer 220 to provide the first data portion D1 to the host 10.

Based on control of the controller 210, the multiplexer 220 may selectively operate in a first operation mode or a second operation mode. In the first operation mode, the multiplexer 220 selectively couples the first input end I1 of the multiplexer 220 to the output end of the multiplexer 220, and in the second operation mode, the multiplexer 220 selectively couples the second input end I2 of the multiplexer 220 to the output end of the multiplexer 220. In other words, the multiplexer 220 may selectively couple the main buffer circuit 120 to the interface circuit 130, or couple the ECC decoding circuit 110 to the interface circuit 130. Therefore, in this embodiment, in the first operation mode, the first data portion D1 in the decoded codeword may be transmitted to the interface circuit 130 via the main buffer circuit 120. In the second operation mode, the first data portion D1 in the decoded codeword may be transmitted to the interface circuit 130 by bypassing the main buffer circuit 120.

The controller 210 may be a conventional flash memory controller or other controllers. The controller 210 may determine whether the reading operation that the host 10 performs on the NVM apparatus 200 is sequential reading. When the host 10 performs sequential reading on the NVM apparatus 200, the controller 210 may control the multiplexer 220 through a control signal CS for the multiplexer 220 to operate in a first mode, that is, enabling the first data portion D1 to be transmitted to the interface circuit 130 via the main buffer circuit 120. When the host 10 performs non-sequential reading on the NVM apparatus 200, the controller 210 may control the multiplexer 220 through the control signal CS for the multiplexer 220 to operate in a second mode, that is, enabling the first data portion D1 to be transmitted to the interface circuit 130 by bypassing the main buffer circuit 120. The interface circuit 130 may receive the first data portion D1 from the output end of the multiplexer 220 and provide the first data portion D1 to the host 10. When non-sequential reading is performed on the NVM 101, the buffer function of the main buffer circuit 120 may not be required. Therefore, during non-sequential reading, the NVM apparatus 200 provided in the embodiment of FIG. 2 may bypass the main buffer circuit 120 to transmit the first data portion D1 to the host 10, so as to reduce transmission delay of the read data.

Figure 3:
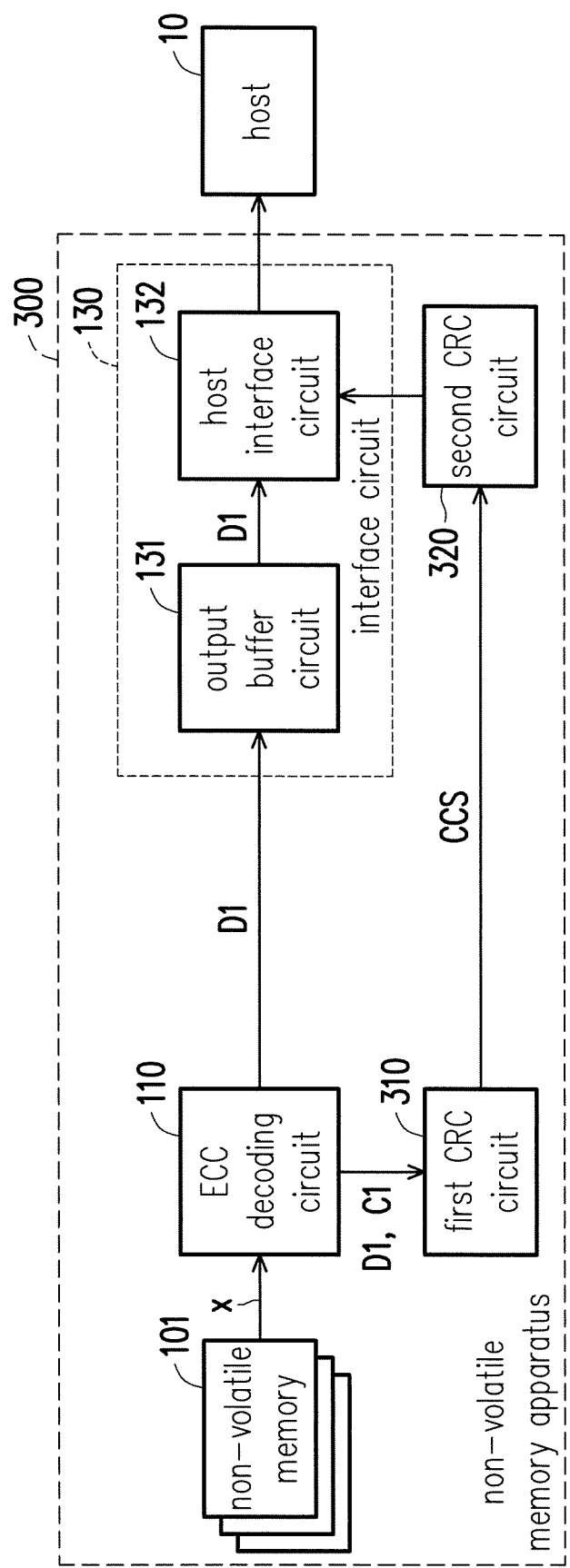
FIG. 3 is a circuit block diagram illustrating a NVM apparatus according to another embodiment of the invention.

If the decoding speed of the ECC decoding circuit 110 matches the reading speed of the host 10, the main buffer circuit 120 may be omitted. For example, FIG. 3 is a circuit block diagram illustrating a NVM apparatus 300 according to another embodiment of the invention. The NVM apparatus 300 is coupled to a host 10. The NVM apparatus 300 may provide the host 10 a storage space. Details of the host 10 as shown in FIG. 3 have been specified above with reference to FIG. 1. The NVM apparatus 300 may be a PCMCIA card, a CF card, a SMC, a memory stick, a MMC (such as RS-MMC and MMC-micro), a SD card (such as mini SD, micro SD, and SDHC), a UFS device, a solid state disk/drive (SSD), etc. The NVM apparatus 300 may store audio, image, video data, and/or other digital data for different application contexts. The connection interface between the host 10 and the NVM apparatus 300 may be inferred from the descriptions of the NVM apparatus 100 shown in FIG. 1.

The NVM apparatus 300 includes a NVM 101, an error checking and correcting (ECC) decoding circuit 110, an interface circuit 130, a first cyclic redundancy check (CRC) circuit 310, and a second CRC circuit 320. The interface circuit 130 is coupled to the host 10 via the standardized interface (or non-standard interface). Details of the NVM 101, the ECC decoding circuit 110, and the interface circuit 130 as shown in FIG. 3 have been specified above with reference to FIG. 1 and thus are not repeated hereinafter. In the embodiment shown in FIG. 3, the interface circuit 130 is coupled to the output end of the ECC decoding circuit 110 to receive the first data portion D1 in the decoded codeword and provide the first data portion D1 to the host 10. In the embodiment shown in FIG. 3, the interface circuit 130 may include an output buffer circuit 131 and a host interface circuit 132. Details of the output buffer circuit 131 and the host interface circuit 132 as shown in FIG. 3 have been specified above with reference to FIG. 1 and thus are not repeated hereinafter.

The first CRC circuit 310 is coupled to the ECC decoding circuit 110 for receiving the first data portion D1 and the first CRC code C1 in the decoded codeword. The first CRC circuit 310 may perform a first cyclic redundancy check (CRC) on the first data portion D1 to determine whether the first data portion D1 is correct. Based on the relationship between the result of the first cyclic redundancy check and the first CRC code C1, the first CRC circuit 310 may generate a check status message CCS correspondingly. The first CRC circuit 310 may use any algorithm to perform the first cyclic redundancy check on the first data portion D1, such as the conventional algorithm or other cyclic redundancy check algorithms.

For example, the first CRC circuit 310 may generate a calculated CRC code according to the first data portion D1. If the original codeword x is not erroneous (that is, the first data portion D1 and the first CRC code C1 are not erroneous), the calculated CRC code is the same as the first CRC code C1 in the decoded codeword. In that case, the first CRC circuit 310 determines the content of the first data portion D1 as correct and sends the determination result (the result of the first cyclic redundancy check) to the second CRC circuit 320 through the check status message CCS. On the other hand, if the original codeword x is erroneous (that is, the first data portion D1 or the first CRC code C1 is erroneous), the calculated CRC code is different from the first CRC code C1 in the decoded codeword. In that case, the first CRC circuit 310 determines the content of the first data portion D1 as erroneous and sends the determination result to the second CRC circuit 320 through the check status message CCS.

In the embodiment shown in FIG. 3, the second CRC circuit 320 and the host interface circuit 132 may be different components that are independent of each other. The second CRC circuit 320 is coupled to the host interface circuit 132 (or the output buffer circuit 131) of the interface circuit 130 to receive the first data portion D1. Moreover, in other embodiments, the second CRC circuit 320 may be embedded in the host interface circuit 132 of the interface circuit 130, but the invention is not limited thereto. The second CRC circuit 320 may perform a second cyclic redundancy check on the first data portion D1 to generate a second CRC code. According to the design requirements, the second CRC circuit 320 may use any algorithm to perform the second cyclic redundancy check on the first data portion D1, such as the conventional algorithm or other cyclic redundancy check algorithms. In some embodiments, the second cyclic redundancy check performed by the second CRC circuit 320 may be the same as the first cyclic redundancy check performed by the first CRC circuit 310. In some other embodiments, the second cyclic redundancy check performed by the second CRC circuit 320 may be different from the first cyclic redundancy check performed by the first CRC circuit 310. According to the check status message CCS provided by the first CRC circuit 310, the second CRC circuit 320 determines whether to further change the second CRC code to make the second CRC code not match the first data portion D1.

More specifically, when the interface circuit 130 receives the first data portion D1, the second CRC circuit 320 may generate a second CRC code according to the first data portion D1 received by the interface circuit 130. If the check status message CCS indicates that the result of the first cyclic redundancy check performed by the first CRC circuit 310 is correct (that is, the content of the first data portion D1 is correct), the second CRC circuit 320 maintains the second CRC code that matches the first data portion D1 and provides the second CRC code to the host 10 via the interface circuit 130. The host 10 may perform a cyclic redundancy check on the first data portion D1 according to the calculated CRC code that is received to determine whether the first data portion D1 received by the host 10 is correct.

On the other hand, if the check status message CCS indicates that the result of the first cyclic redundancy check performed by the first CRC circuit 310 is erroneous (that is, the content of the first data portion D1 is erroneous), the second CRC circuit 320 further changes the second CRC code to make the second CRC code not match the first data portion D1. After the second CRC circuit 320 further changes the second CRC code, the interface circuit 130 receives the second CRC code from the second CRC circuit 320 and provides the second CRC code to the host 10. When the host 10 receives the second CRC code that does not match the first data portion D1, the host 10 determines that the first data portion D1 provided by the interface circuit 130 is erroneous and discards the received first data portion D1. According to the design requirements, the second CRC circuit 320 may change the second CRC code that matches the first data portion D1 to the second CRC code that does not match the first data portion D1 by any means. In an example (but not limited thereto), after the second CRC circuit 320 performs the second cyclic redundancy check to generate the second CRC code, if the check status message CCS indicates that the result of the first cyclic redundancy check performed by the first CRC circuit 310 is erroneous, the second CRC circuit 320 may perform bit reversal on the second CRC code, so as to change the second CRC code that matches the first data portion D1 to the second CRC code that does not match the first data portion D1.

To sum up, the NVM apparatus 300 provided in the embodiment of FIG. 3 may perform cyclic redundancy check on the first data portion D1 and determine whether to transmit the correct CRC code to the host 10 according to whether the first data portion D1 is correct.

Figure 4:
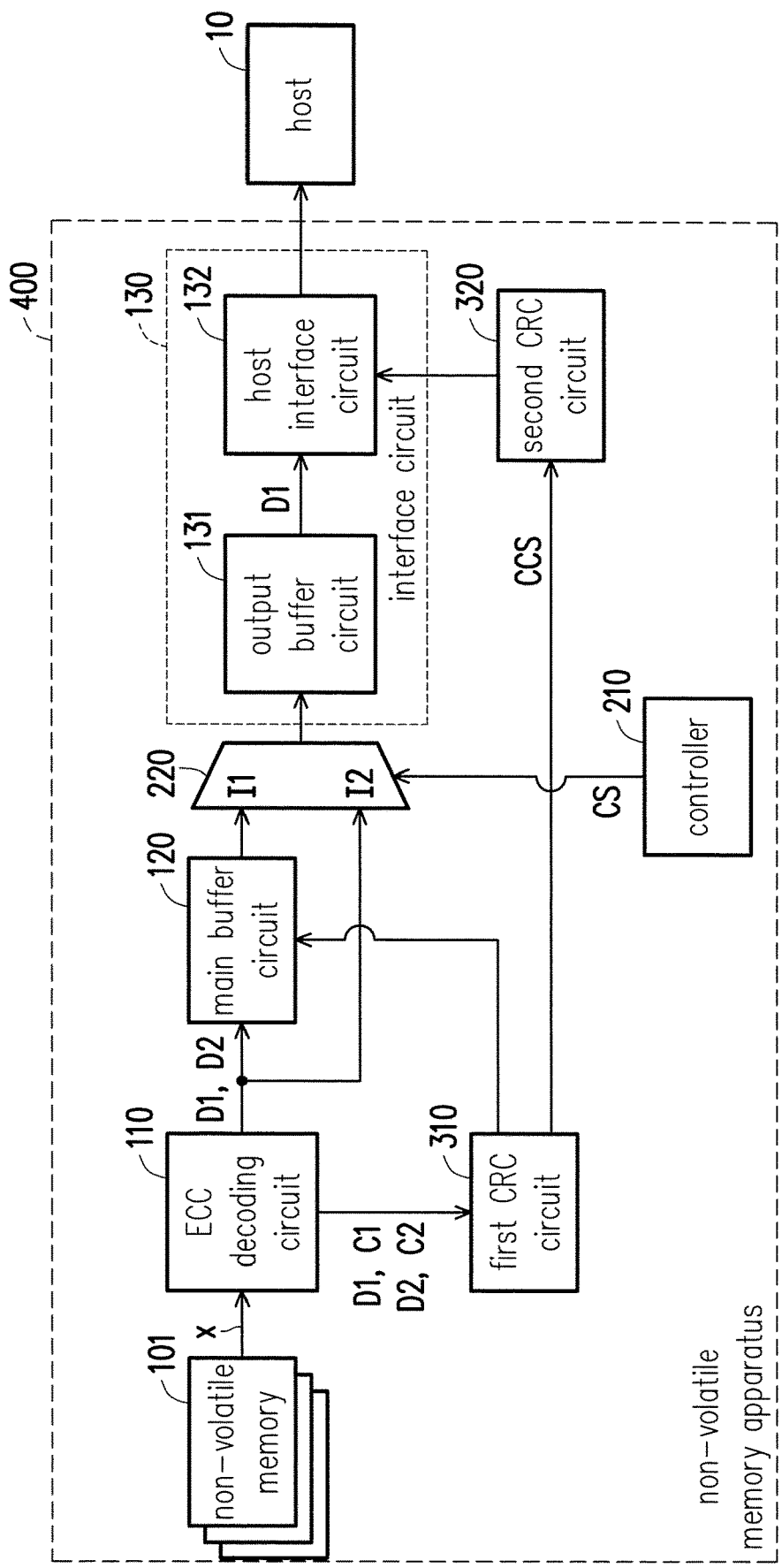
FIG. 4 is a circuit block diagram illustrating another NVM apparatus formed by combining the embodiments of FIG. 2 and FIG. 3.

FIG. 4 is a circuit block diagram illustrating another NVM apparatus 400 formed by combining the embodiments of FIG. 2 and FIG. 3. The NVM apparatus 400 is coupled to a host 10. The NVM apparatus 400 may provide the host 10 a storage space. Details of the host 10 as shown in FIG. 4 have been specified above with reference to FIG. 1. The NVM apparatus 400 may be a PCMCIA card, a CF card, a SMC, a memory stick, a MMC (such as RS-MMC and MMC-micro), a SD card (such as mini SD, micro SD, and SDHC), a UFS device, a solid state disk/drive (SSD), etc. The NVM apparatus 400 may store audio, image, video data, and/or other digital data for different application contexts.

The NVM apparatus 400 includes a NVM 101, an error checking and correcting (ECC) decoding circuit 110, a main buffer circuit 120, a controller 210, a multiplexer 220, an interface circuit 130, a first cyclic redundancy check (CRC) circuit 310, and a second CRC circuit 320. The interface circuit 130 is coupled to the host 10 via the standardized interface (or non-standard interface). The connection interface between the host 10 and the interface circuit 130 may be inferred from the descriptions of the NVM apparatus 100 shown in FIG. 1. Details of the NVM 101, the ECC decoding circuit 110, the main buffer circuit 120, the interface circuit 130, and the first CRC circuit 310 as shown in FIG. 4 may be inferred from the descriptions of the NVM 101, the ECC decoding circuit 110, the main buffer circuit 120, the interface circuit 130, and the CRC circuit 140 shown in FIG. 1 respectively. Details of the main buffer circuit 120, the controller 210, the multiplexer 220, and the interface circuit 130 as shown in FIG. 4 have been specified above with reference to FIG. 2, and details of the ECC decoding circuit 110, the interface circuit 130, the first CRC circuit 310, and the second CRC circuit 320 as shown in FIG. 4 have been specified above with reference to FIG. 3 and thus are not repeated hereinafter.

In the embodiment of FIG. 4, the ECC decoding circuit 110 performs ECC decoding on the data that is to be read (the original codeword x) to obtain the decoded codeword, wherein the decoded codeword may be divided into at least two portions. The first portion includes the first data portion D1 and the first CRC code C1 for checking the correctness of the first data portion D1, and the second portion includes a second data portion D2 and a second CRC code C2 for checking the correctness of the second data portion D2. The input end of the main buffer circuit 120 is coupled to the output end of the ECC decoding circuit 110 for receiving and storing the first data portion D1 and the second data portion D2 in the decoded codeword.

The controller 210 may control the multiplexer 220 through the control signal CS. For example, when the host 10 performs sequential reading on the NVM apparatus 400, the controller 210 may control the multiplexer 220 through the control signal CS for enabling the first data portion D1 and the second data portion D2 to be transmitted to the interface circuit 130 via the main buffer circuit 120. When the host 10 performs non-sequential reading on the NVM apparatus 400, the controller 210 may control the multiplexer 220 through the control signal CS for enabling the first data portion D1 and the second data portion D2 to be transmitted to the interface circuit 130 by bypassing the main buffer circuit 120.

After the ECC decoding circuit 110 completes the ECC decoding, the first CRC circuit 310 may use the first CRC code C1 to check whether the first data portion D1 is erroneous. If the first data portion D1 in the decoded codeword is not erroneous, the main buffer circuit 120 may transmit the first data portion D1 to the interface circuit 130. In addition, if the first data portion D1 is not erroneous, the second CRC circuit 320 provides the CRC code that matches the first data portion D1 to the host 10. If the first data portion D1 is erroneous, the first CRC circuit 310 may send a signal to the main buffer circuit 120 to prevent the main buffer circuit 120 from transmitting the erroneous first data portion D1 to the interface circuit 130. In addition, if the first data portion D1 is erroneous, the first CRC circuit 310 notifies the second CRC circuit 320 through the check status message CCS, and the second CRC circuit 320 provides the CRC code that does not match the first data portion D1 (the further changed CRC code) to the host 10 according to the check status message CCS. When the host 10 receives the CRC code that does not match the first data portion D1, the host 10 determines that the first data portion D1 provided by the interface circuit 130 is erroneous and discards the received first data portion D1.

The first CRC circuit 310 may also use the second CRC code C2 to check whether the second data portion D2 is erroneous. If the second data portion D2 in the decoded codeword is not erroneous, the main buffer circuit 120 may transmit the second data portion D2 to the interface circuit 130. In addition, if the second data portion D2 is not erroneous, the second CRC circuit 320 provides the CRC code that matches the second data portion D2 to the host 10. If the second data portion D2 is erroneous, the first CRC circuit 310 may send a signal to the main buffer circuit 120 to prevent the main buffer circuit 120 from transmitting the erroneous second data portion D2 to the interface circuit 130. In addition, if the second data portion D2 is erroneous, the first CRC circuit 310 notifies the second CRC circuit 320 through the check status message CCS, and the second CRC circuit 320 provides the CRC code that does not match the second data portion D2 (the further changed CRC code) to the host 10 according to the check status message CCS. When the host 10 receives the CRC code that does not match the second data portion D2, the host 10 determines that the second data portion D2 provided by the interface circuit 130 is erroneous and discards the received second data portion D2.

Figure 5A:
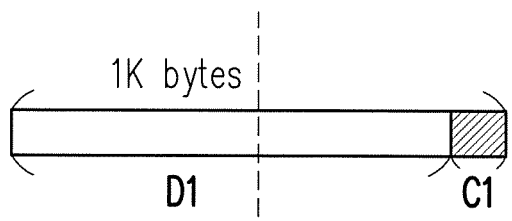
FIG. 5A and FIG. 5B are diagrams illustrating data structures of the decoded codewords according to different embodiments of the invention.
Figure 5B:
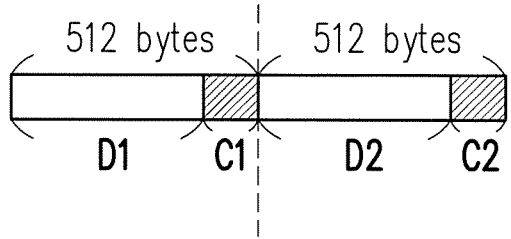

FIG. 5A and FIG. 5B are diagrams illustrating data structures of the decoded codewords according to different embodiments of the invention. The data structures of the decoded codewords shown in FIG. 5A and FIG. 5B are applicable to the NVM apparatus 100, the NVM apparatus 200, the NVM apparatus 300 and/or the NVM apparatus 400. Take the NVM apparatus 100 shown in FIG. 1 as an example, the decoded codeword outputted by the ECC decoding circuit 110 has the data structure shown in FIG. 5A, wherein the decoded codeword has a length of 1K bytes, which includes the first CRC code C1 and the first data portion D1.

Take the NVM apparatus 400 shown in FIG. 4 as an example, the decoded codeword outputted by the ECC decoding circuit 110 has the data structure shown in FIG. 5B, wherein the decoded codeword has a length of 1K bytes, which includes two portions each having a length of 512 bytes. The first portion of the decoded codeword includes the first data portion D1 and the first CRC code C1 for checking the correctness of the first data portion D1, and the second portion of the decoded codeword includes the second data portion D2 and the second CRC code C2 for checking the correctness of the second data portion D2. Thus, by setting the length of the data transmitted by the interface circuit 130 each time to 512 bytes, the NVM apparatus 400 is able to transmit the data to the host 10 without waiting for completion of the cyclic redundancy check of the entire 1K bytes (the entire decoded codeword), so as to accelerate the read rate of the NVM apparatus 400.

Figure 6A:
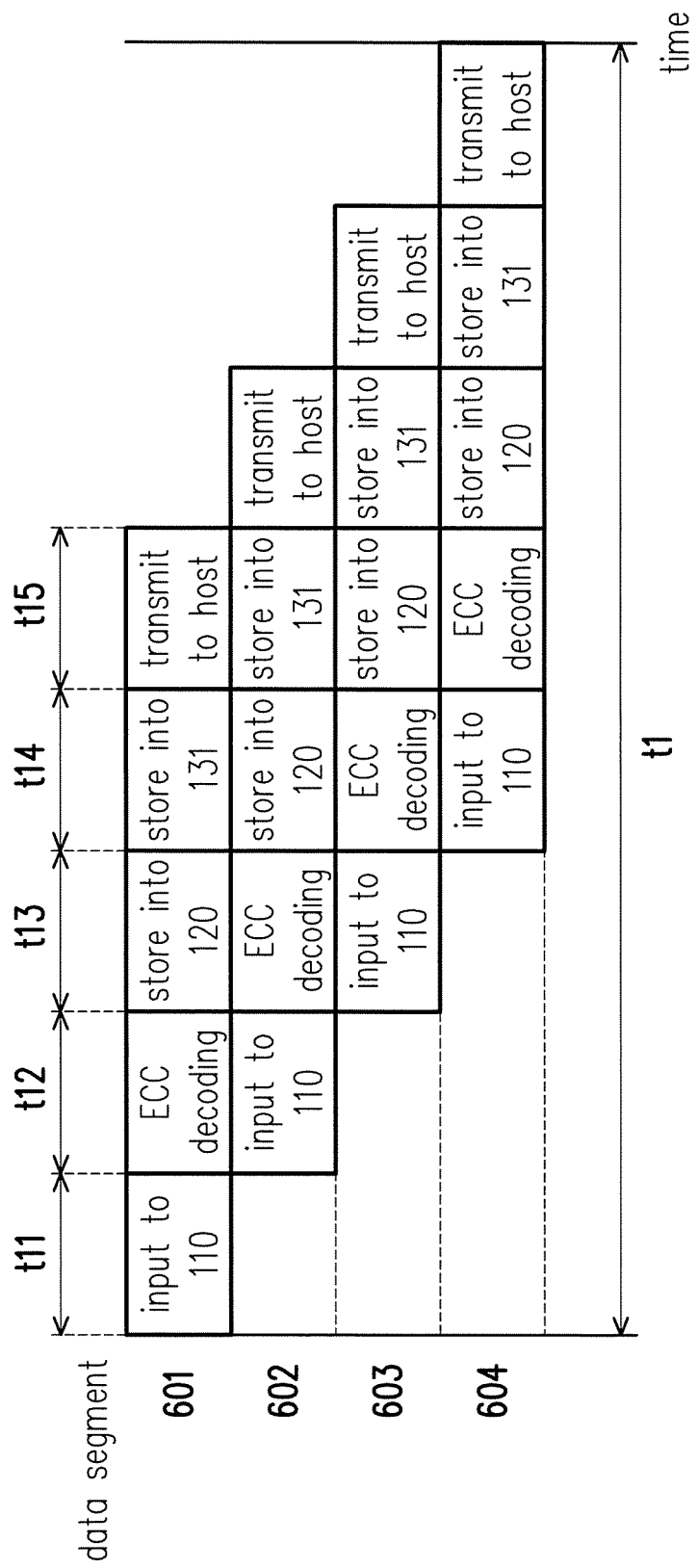
FIG. 6A is a diagram illustrating the pipeline stages of the NVM apparatus shown in FIG. 1.
Figure 6B:
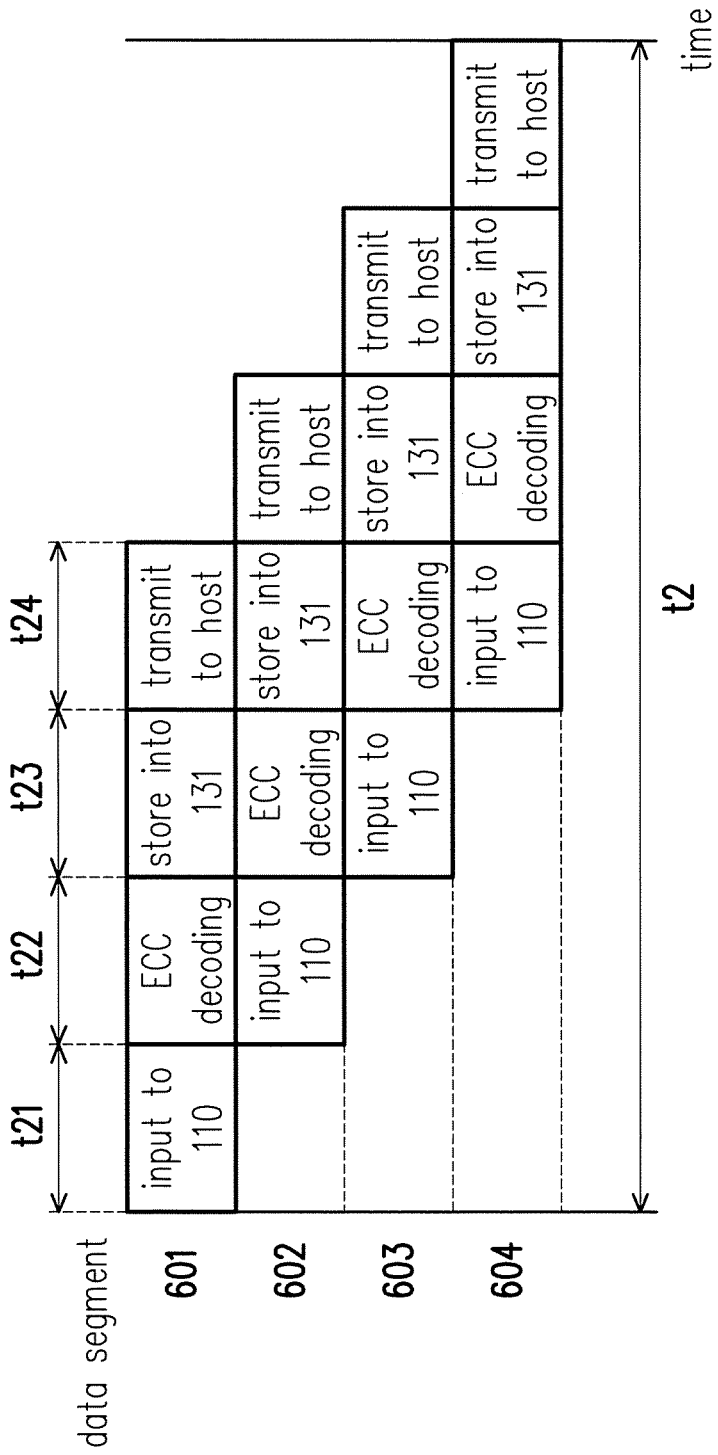
FIG. 6B is a diagram illustrating the pipeline stages of the NVM apparatus shown in FIG. 4.

FIG. 6A and FIG. 6B are diagrams for comparing the pipeline stages of the NVM apparatus 100 shown in FIG. 1 and the NVM apparatus 400 shown in FIG. 4. In FIG. 6A and FIG. 6B, the horizontal axis represents time and the vertical axis represents data segment. Here, it is assumed that the length of one piece of data that the host 10 reads from the NVM 101 is 4K bytes, and the length of the data that the ECC decoding circuit 110 decodes each time is 1K bytes. First, please refer to FIG. 1 and FIG. 6A. It is known from FIG. 1 that when one piece of data (4K bytes) is read from the NVM 101 by the method of FIG. 1, the data of 4K bytes is divided into four data segments 601, 602, 603, and 604 (each 1K bytes), and the four data segments 601 to 604 sequentially enter the pipeline shown in FIG. 1. The pipeline includes the ECC decoding circuit 110, the main buffer circuit 120, the output buffer circuit 131, and the host interface circuit 132. Take the data segment 601 as an example, the data segment 601 is inputted from the NVM 101 to the ECC decoding circuit 110 in a time t11, the ECC decoding circuit 110 decodes the data segment 601 to obtain the decoded codeword in a time t12, the first data portion D1 in the decoded codeword is stored in the main buffer circuit 120 in a time t13, the first data portion D1 is stored from the main buffer circuit 120 to the output buffer circuit 131 in a time t14, and the host interface circuit 132 transmits the first data portion D1 from the output buffer circuit 131 to the host 10 in a time t15. The other data segments 602 to 604 may be processed accordingly and thus are not repeated hereinafter. A read latency t1 of the data segments 601 to 604 shown in FIG. 6A may be represented by the following equation:

$t1=4*$(time for inputting the data into the ECC decoding circuit)+(ECC decoding time)+(time for storing the data into the main buffer circuit)+(time for storing the data into the output buffer circuit)+(host interface circuit time)

Next, please refer to FIG. 4 and FIG. 6B. Same as the condition of FIG. 6A, in the example shown in FIG. 6B, it is also assumed that the length of one piece of data that the host 10 reads from the NVM 101 is 4K bytes, and the length of the data that the ECC decoding circuit 110 decodes each time is 1K bytes. The data of 4K bytes is divided into four data segments 601, 602, 603, and 604 (each 1K bytes). It is known from the embodiment of FIG. 4 that when the NVM apparatus 400 operates in the second operation mode, that is, when the multiplexer 220 couples the second input end I2 to the output end thereof, the pipeline shown in FIG. 4 includes the ECC decoding circuit 110, the output buffer circuit 131, and the host interface circuit 132. The four data segments 601 to 604 sequentially enter the pipeline shown in FIG. 4. Take the data segment 601 as an example, the data segment 601 is inputted from the NVM 101 to the ECC decoding circuit 110 in a time t21, the ECC decoding circuit 110 decodes the data segment 601 to obtain the decoded codeword in a time t22, the first data portion D1 in the decoded codeword is stored in the output buffer circuit 131 in a time t23, and the host interface circuit 132 outputs the first data portion D1 from the output buffer circuit 131 to the host 10 in a time t24. The other data segments 602 to 604 may be processed accordingly and thus are not repeated hereinafter. A read latency t2 of the data segments 601 to 604 shown in FIG. 6B may be represented by the following equation:

$t2=4*$(time for inputting the data into the ECC decoding circuit)+(ECC decoding time)+(time for storing the data into the output buffer circuit)+(host interface circuit time)

It is known from FIG. 6A and FIG. 6B that, as compared with the read latency t1 of the NVM apparatus 100 of FIG. 1, the read latency t2 of the NVM apparatus 400 is reduced effectively when the NVM apparatus 400 shown in FIG. 4 operates in the second operation mode.

Figure 7:
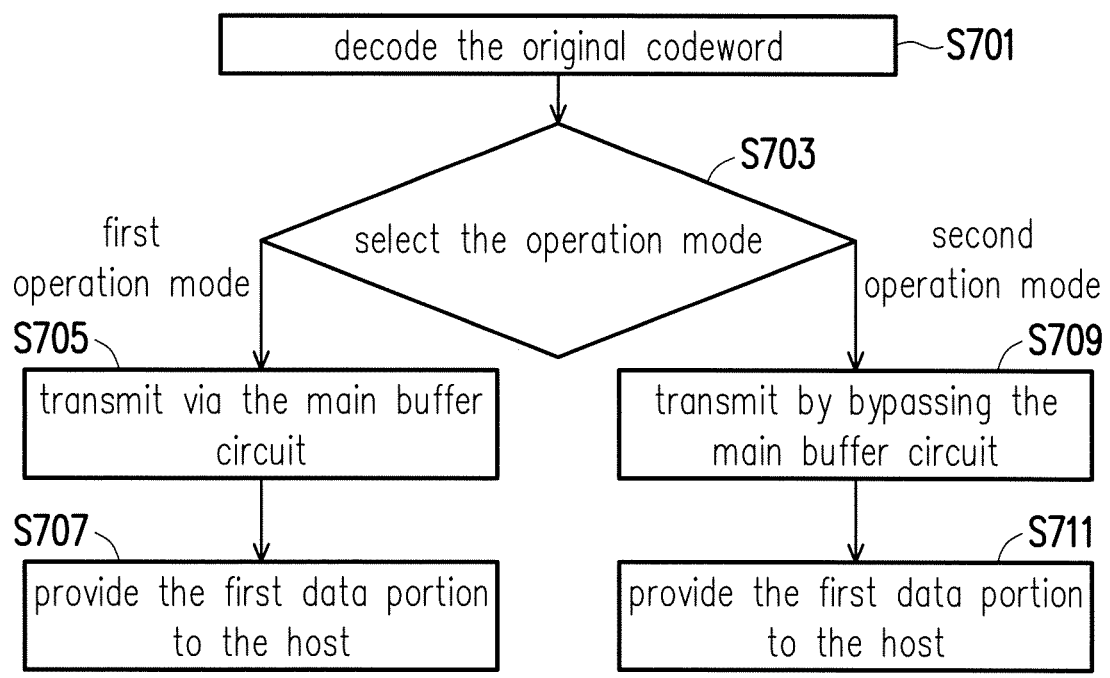
FIG. 7 is a flowchart illustrating a reading method of the NVM apparatus shown in FIG. 2 according to another embodiment of the invention.

FIG. 7 is a flowchart illustrating a reading method of the NVM apparatus 200 shown in FIG. 2 according to another embodiment of the invention. In Step S701, the NVM apparatus 200 uses the ECC decoding circuit 110 to decode the original codeword x to obtain the decoded codeword. In Step S703, according to the characteristic (sequential reading or non-sequential reading) of the reading operation that the host 10 executes on the NVM apparatus 200, the controller 210 may correspondingly control the multiplexer 220 to select the operation mode. If the first operation mode is selected, the process proceeds to Step S705. If the second operation mode is selected, the process proceeds to Step S709. In Step S705, that is, in the first operation mode, the NVM apparatus 200 may transmit the first data portion D1 in the decoded codeword outputted by the ECC decoding circuit 110 to the interface circuit 130 via the main buffer circuit 120. Then, in Step S707, the interface circuit 130 provides the first data portion D1 to the host 10. In Step S709, that is, in the second operation mode, the NVM apparatus 200 may transmit the first data portion D1 outputted by the ECC decoding circuit 110 to the interface circuit 130 by bypassing the main buffer circuit 120. Then, in Step S711, the interface circuit 130 provides the first data portion D1 to the host 10.

Figure 8:
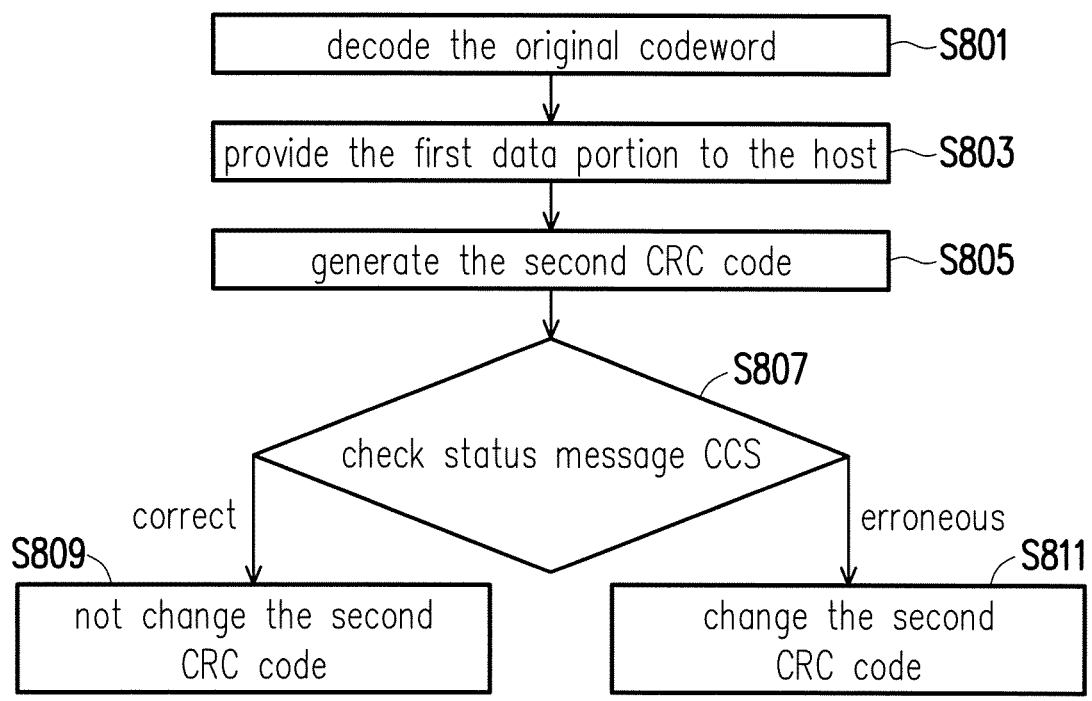
FIG. 8 is a flowchart illustrating a reading method of the NVM apparatus shown in FIG. 3 according to another embodiment of the invention.

FIG. 8 is a flowchart illustrating a reading method of the NVM apparatus 300 shown in FIG. 3 according to another embodiment of the invention. In Step S801, the NVM apparatus 300 uses the ECC decoding circuit 110 to decode the original codeword x to obtain the decoded codeword, wherein the decoded codeword includes the first data portion D1 and the first CRC code C1. After the ECC decoding circuit 110 completes the decoding and generates the decoded codeword, the first CRC circuit 310 may perform the first cyclic redundancy check (CRC) on the first data portion D1 provided by the ECC decoding circuit 110, and generate the check status message CCS based on the relationship between the result of the first cyclic redundancy check and the first CRC code C1. In Step S803, the interface circuit 130 provides the first data portion D1 to the host 10. In Step S805, the second CRC circuit 320 performs the second cyclic redundancy check on the first data portion D1 provided by the interface circuit 130 to generate the second CRC code.

In Step S807, the second CRC circuit 320 determines whether the first data portion D1 is correct based on the check status message CCS. According to the check status message CCS, the second CRC circuit 320 determines whether to further change the second CRC code generated in Step S805 to make the second CRC code not match the first data portion D1. If the check status message CCS indicates that the result of the first cyclic redundancy check of the first CRC circuit 310 is correct (that is, the first data portion D1 is correct), the process proceeds to Step S809. In Step S809, the second CRC circuit 320 maintains (does not change) the second CRC code generated in Step S805, and provides the second CRC code that matches the first data portion D1 to the host 10. If the check status message CCS indicates that the result of the first cyclic redundancy check of the first CRC circuit 310 is erroneous (that is, the first data portion D1 is erroneous), the process proceeds to Step S811. In Step S811, the second CRC circuit 320 further changes the second CRC code generated in Step S805 to make the second CRC code not match the first data portion D1. After changing the second CRC code, the second CRC circuit 320 provides the changed second CRC code to the host 10 via the host interface circuit 132.

Figure 9:
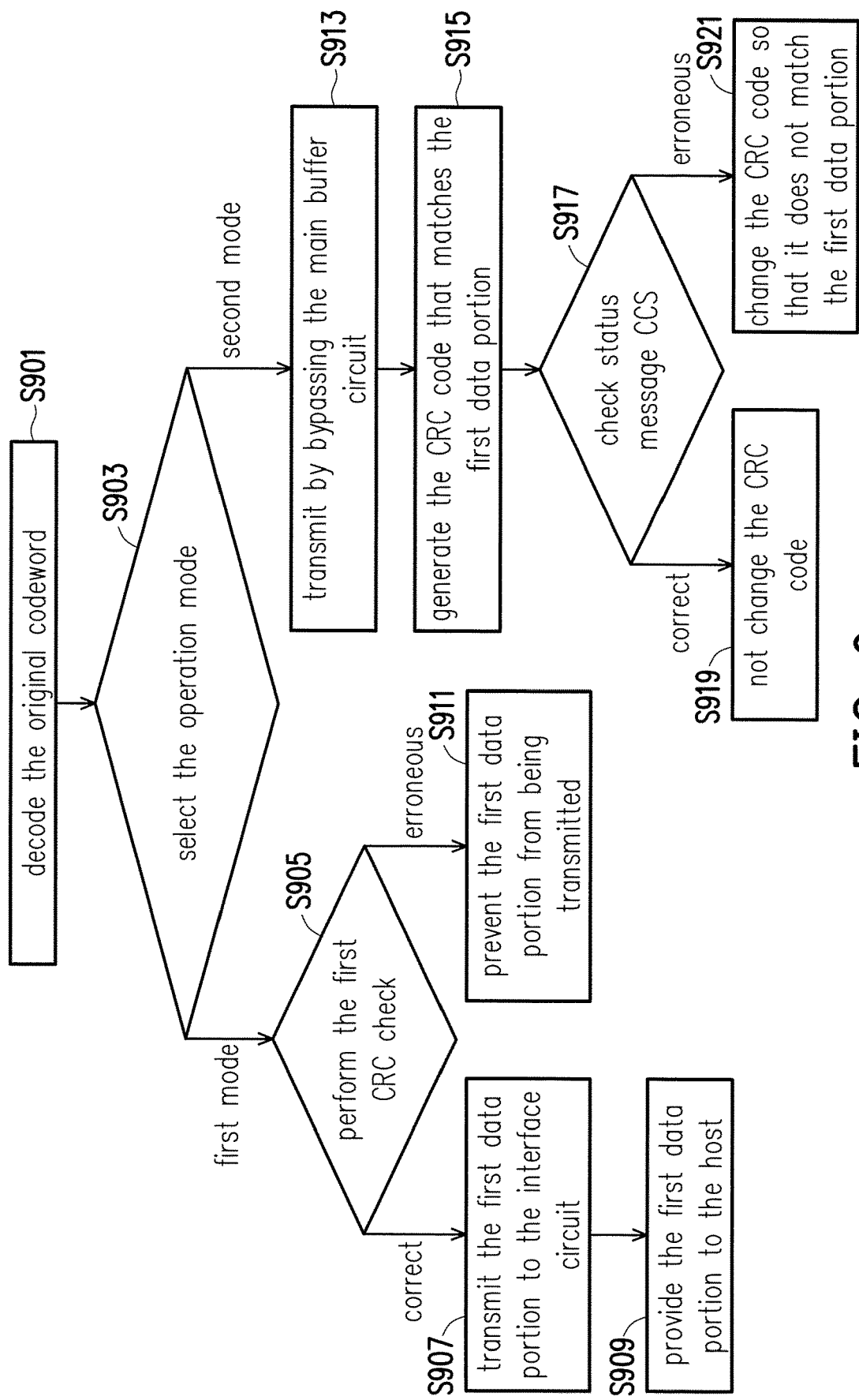
FIG. 9 is a flowchart illustrating a reading method of the NVM apparatus shown in FIG. 4 according to another embodiment of the invention.

FIG. 9 is a flowchart illustrating a reading method of the NVM apparatus 400 shown in FIG. 4 according to another embodiment of the invention. In Step S901, the NVM apparatus 400 uses the ECC decoding circuit 110 to decode the original codeword x to obtain the decoded codeword. In Step S903, according to the characteristic (sequential reading or non-sequential reading) of the reading operation that the host 10 executes on the NVM apparatus 400, the controller 210 may correspondingly control the multiplexer 220 to select the operation mode. If the first operation mode is selected, the process proceeds to Step S905. If the second operation mode is selected, the process proceeds to Step S913.

The main buffer circuit 120 receives and temporarily stores the first data portion D1 in the decoded codeword outputted by the ECC decoding circuit 110. In Step S905, that is, in the first operation mode, the first CRC circuit 310 performs the first cyclic redundancy check on the first data portion D1. If it is determined in Step S905 that the first data portion D1 is correct, the process proceeds to Step S907. In Step S907, the main buffer circuit 120 transmits the first data portion D1 to the interface circuit 130. Then, in Step S909, the interface circuit 130 provides the first data portion D1 to the host 10. If it is determined in Step S905 that the first data portion D1 is erroneous, the process proceeds to Step S911. In Step S911, the first CRC circuit 310 may send a signal to the main buffer circuit 120 to notify that the first data portion D1 is erroneous, so as to prevent the main buffer circuit 120 from continuing transmitting the first data portion D1 to the interface circuit 130.

In Step S913, that is, in the second operation mode, the NVM apparatus 400 may transmit the first data portion D1 to the interface circuit 130 by bypassing the main buffer circuit 120. After the ECC decoding circuit 110 completes the decoding and generates the decoded codeword, the first CRC circuit 310 may perform the first cyclic redundancy check (CRC) on the first data portion D1 provided by the ECC decoding circuit 110, and generate the check status message CCS for the second CRC circuit 320 based on the relationship between the result of the first cyclic redundancy check and the first CRC code C1. In Step S915, the interface circuit 130 provides the first data portion D1 to the host 10. When the first data portion D1 is transmitted to the interface circuit 130, the second CRC circuit 320 performs the second cyclic redundancy check on the first data portion D1 provided by the interface circuit 130 to generate the CRC code that matches the first data portion D1. In Step S917, the second CRC circuit 320 determines whether the first data portion D1 is correct based on the check status message CCS. According to the check status message CCS, the second CRC circuit 320 may determine whether to further change the CRC code generated in Step S915 to make the CRC code not match the first data portion D1. If the check status message CCS indicates that the result of the first cyclic redundancy check of the first CRC circuit 310 is correct (that is, the first data portion D1 is correct), the process proceeds to Step S919. In Step S919, the second CRC circuit 320 does not change the CRC code generated in Step S915, that is, the second CRC circuit 320 maintains the CRC code generated in Step S915 to match the first data portion D1. The second CRC circuit 320 provides the CRC code that matches the first data portion D1 to the host 10 via the host interface circuit 132. If the check status message CCS indicates that the result of the first cyclic redundancy check of the first CRC circuit 310 is erroneous (that is, the first data portion D1 is erroneous), the process proceeds to Step S921. In Step S921, the second CRC circuit 320 further changes the CRC code generated in Step S915 to make the CRC code that matches the first data portion D1 become a CRC code that does not match the first data portion D1. After changing the CRC code, the second CRC circuit 320 provides the CRC code that does not match the first data portion D1 to the host 10.

It should be noted that, in different application contexts, the related functions of the NVM apparatus and/or the host may be implemented as software, firmware, or hardware by using general programming languages (e.g., C or C++), hardware description languages (e.g., Verilog HDL or VHDL), or other suitable programming languages. The software (or firmware) capable of executing the related functions may be deployed as any known computer-accessible media, such as magnetic tapes, semiconductor memories, magnetic disks, and compact disks (e.g., CD-ROM or DVD-ROM), or the software (or firmware) may be transmitted through the Internet, wired communication, wireless communication, or other communication media. The software (or firmware) may be stored in an accessible medium of a computer for a processor of the computer to access/execute programming codes of the software (firmware). In addition, the apparatus and method of the invention may be implemented by a combination of hardware and software.

In conclusion, the NVM apparatus and the reading method thereof provided in the embodiments of the invention reduce the pipeline stages that the NVM apparatus goes through during non-sequential reading. Therefore, the NVM apparatus provided in the embodiments improves the non-sequential read rate. Moreover, the NVM apparatus provided in the embodiments may provide the result of checking the transmitted data to the host by changing the CRC code at the interface between the flash memory and the host, so as to prevent the host from using erroneous transmitted data.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A non-volatile memory apparatus, comprising:
an error checking and correcting decoding circuit configured to perform error checking and correcting to an original codeword to generate a decoded codeword;
a main buffer circuit coupled to an output end of the error checking and correcting decoding circuit to receive and store a first data portion of the decoded codeword, wherein the decoded codeword comprises the first data portion and a first cyclic redundancy check code;
a multiplexer having a first input end and a second input end, wherein the first input end of the multiplexer is coupled to an output end of the main buffer circuit, the second input end of the multiplexer is coupled to the output end of the error checking and correcting decoding circuit to receive the first data portion of the decoded codeword, the multiplexer selectively couples the first input end of the multiplexer to an output end of the multiplexer in a first operation mode, and the multiplexer selectively couples the second input end of the multiplexer to the output end of the multiplexer in a second operation mode;

an interface circuit coupled to the output end of the multiplexer, wherein the interface circuit receives the first data portion from the output end of the multiplexer to provide the first data portion to a host;

a first cyclic redundancy check circuit coupled to the error checking and correcting decoding circuit to receive the first data portion and the first cyclic redundancy check code, wherein the first cyclic redundancy check circuit is configured to perform a first cyclic redundancy check on the first data portion and generate a check status message based on a relationship between a result of the first cyclic redundancy check and the first cyclic redundancy check code;

a second cyclic redundancy check circuit coupled to the interface circuit to receive the first data portion, wherein the second cyclic redundancy check circuit is configured to perform a second cyclic redundancy check on the first data portion to generate and provide a second cyclic redundancy check code, wherein the second cyclic redundancy check circuit determines whether to further change the second cyclic redundancy check code to make the second cyclic redundancy check code not match the first data portion according to the check status message; and a controller configured to configure, in response to determining that the host performs a sequential reading operation on the non-volatile memory apparatus, the multiplexer to operate in the first operation mode, and to configure, in response to determining that the host performs a non-sequential reading operation on the non-volatile memory apparatus, the multiplexer to operate in the second operation mode.

2. The non-volatile memory apparatus according to claim 1,
wherein the first cyclic redundancy check circuit is further configured to determine whether to prevent the main buffer circuit from outputting the first data portion to the multiplexer based on the relationship between the result of the first cyclic redundancy check and the first cyclic redundancy check code.

3. The non-volatile memory apparatus according to claim 2, wherein the decoded codeword further comprises a second data portion and a second cyclic redundancy check code, and the first cyclic redundancy check circuit performs the first cyclic redundancy check on the second data portion and determines whether to prevent the main buffer circuit from outputting the second data portion to the multiplexer based on a relationship between a result of the first cyclic redundancy check of the second data portion and the second cyclic redundancy check code.

4. The non-volatile memory apparatus according to claim 1, wherein:
the second cyclic redundancy check circuit maintains the second cyclic redundancy check code that matches the first data portion when the check status message indicates that the result of the first cyclic redundancy check is correct;

the second cyclic redundancy check circuit further changes the second cyclic redundancy check code so that the second cyclic redundancy check code does not match the first data portion when the check status message indicates that the result of the first cyclic redundancy check is erroneous; and the interface circuit receives the second cyclic redundancy check code from the second cyclic redundancy check circuit to provide the second cyclic redundancy check code to the host.

5. The non-volatile memory apparatus according to claim 4, wherein after the second cyclic redundancy check circuit performs the second cyclic redundancy check to generate the second cyclic redundancy check code, the second cyclic redundancy check circuit further performs bit reversal on the second cyclic redundancy check code so that the second cyclic redundancy check code does not match the first data portion when the check status message indicates that the result of the first cyclic redundancy check is erroneous.

6. A reading method of a non-volatile memory apparatus, the reading method comprising:
performing error checking and correcting on an original codeword to generate a decoded codeword by an error checking and correcting decoding circuit, wherein the decoded codeword comprises the first data portion and a first cyclic redundancy check code;
transmitting the first data portion of the decoded codeword to an interface circuit via a main buffer circuit in a first operation mode;
transmitting the first data portion of the decoded codeword to the interface circuit by bypassing the main buffer circuit in a second operation mode;
performing a first cyclic redundancy check on the first data portion by a first cyclic redundancy check circuit, and generating a check status message based on a relationship between a result of the first cyclic redundancy check and the first cyclic redundancy check code;
performing a second cyclic redundancy check on the first data portion by a second cyclic redundancy check circuit to generate and provide a second cyclic redundancy check code;
determining whether to further change the second cyclic redundancy check code to make the second cyclic redundancy check code not match the first data portion according to the check status message; and
providing the first data portion to a host by the interface circuit, wherein the non-volatile memory apparatus is configured to operate in the first operation mode in response to determining that the host perforins a sequential reading operation on the non-volatile memory apparatus, and the non-volatile memory apparatus is configured to operate in the second operation mode in response to determining that the host performs a non-sequential reading operation on the non-volatile memory apparatus.

7. The reading method according to claim 6, wherein the reading method of the non-volatile memory apparatus further comprises:
determining whether to prevent the main buffer circuit from outputting the first data portion based on the relationship between the result of the first cyclic redundancy check and the first cyclic redundancy check code.

8. The reading method according to claim 7, wherein the decoded codeword further comprises a second data portion and a second cyclic redundancy check code, and the reading method of the non-volatile memory apparatus further comprises:

performing the first cyclic redundancy check on the second data portion, and determining whether to prevent the main buffer circuit from outputting the second data portion based on a relationship between a result of the first cyclic redundancy check of the second data portion and the second cyclic redundancy check code.

9. The reading method according to claim 6, further comprising:

maintaining the second cyclic redundancy check code that matches the first data portion and providing the second cyclic redundancy check code to the host when the check status message indicates that the result of the first cyclic redundancy check is correct;

changing the second cyclic redundancy check code so that the second cyclic redundancy check code does not match the first data portion when the check status message indicates that the result of the first cyclic redundancy check is erroneous; and providing the second cyclic redundancy check code to the host.

\* \* \* \* \*